United States Patent
Profijt et al.

(10) Patent No.: US 10,141,189 B2
(45) Date of Patent: Nov. 27, 2018

(54) METHODS FOR FORMING SEMICONDUCTORS BY DIFFUSION

(71) Applicant: ASM IP Holding B.V., Almere (NL)

(72) Inventors: Harald Profijt, Leuven (BE); Qi Xie, Leuven (BE); Jan Willem Maes, Wilrijk (BE); David Kohen, Leuven (BE)

(73) Assignee: ASM IP HOLDING B.V., Almere (NL)

( * ) Notice: Subject to any disclaimer, the term of this patent is extended or adjusted under 35 U.S.C. 154(b) by 0 days.

(21) Appl. No.: 15/394,571

(22) Filed: Dec. 29, 2016

(65) Prior Publication Data

US 2018/0190793 A1    Jul. 5, 2018

(51) Int. Cl.
| | |
|---|---|
| *H01L 21/225* | (2006.01) |
| *H01L 29/66* | (2006.01) |
| *H01L 29/161* | (2006.01) |
| *H01L 29/10* | (2006.01) |
| *H01L 29/06* | (2006.01) |

(Continued)

(52) U.S. Cl.
CPC .......... *H01L 21/225* (2013.01); *H01L 21/223* (2013.01); *H01L 21/2251* (2013.01); *H01L 21/2256* (2013.01); *H01L 21/385* (2013.01); *H01L 21/76858* (2013.01);

(Continued)

(58) Field of Classification Search
CPC . H01L 21/223; H01L 21/225; H01L 21/2251; H01L 21/823431; H01L 29/16; H01L 29/66795; H01L 29/785; H01L 29/36; H01L 27/0886; H01L 21/2256; H01L 21/76858; H01L 21/385
See application file for complete search history.

(56) References Cited

U.S. PATENT DOCUMENTS

| | | | |
|---|---|---|---|
| 8,497,177 B1 * | 7/2013 | Chang | ............... H01L 29/66795 438/283 |
| 8,957,476 B2 | 2/2015 | Glass et al. | |

(Continued)

OTHER PUBLICATIONS

Tong et al., "Siconi Process Applications Study for 28nm Technology Node and Beyond", downloaded on Apr. 23, 2015, ECS Transactions, 2014, pp. 447-451.

*Primary Examiner* — Joseph C Nicely
(74) *Attorney, Agent, or Firm* — Knobbe, Martens, Olson & Bear LLP

(57) ABSTRACT

In some embodiments, a compound semiconductor is formed by diffusion of semiconductor species from a source semiconductor layer into semiconductor material in a substrate. The source semiconductor layer may be an amorphous or polycrystalline structure, and provides a source of semiconductor species for later diffusion into the other semiconductor material. Advantageously, such a semiconductor layer may be more conformal than an epitaxially grown, crystalline semiconductor layer. As a result, this more conformal semiconductor layer acts as a uniform source of the semiconductor species for diffusion into the semiconductor material in the substrate. In some embodiments, an interlayer is formed between the source semiconductor layer and the substrate, and then the interlayer is trimmed before depositing the source semiconductor layer. In some other embodiments, the source semiconductor layer is deposited directly on the substrate, and has an amorphous or polycrystalline structure.

24 Claims, 6 Drawing Sheets

(51) Int. Cl.
*H01L 21/223* (2006.01)
*H01L 21/768* (2006.01)
*H01L 21/385* (2006.01)

(52) U.S. Cl.
CPC ...... *H01L 29/0676* (2013.01); *H01L 29/1033* (2013.01); *H01L 29/161* (2013.01); *H01L 29/66666* (2013.01)

(56) References Cited

U.S. PATENT DOCUMENTS

| | | | |
|---|---|---|---|
| 9,257,556 B2 | 2/2016 | Xu et al. | |
| 9,349,860 B1* | 5/2016 | Afzalian | H01L 29/7827 |
| 2011/0024804 A1* | 2/2011 | Chang | H01L 29/165 |
| | | | 257/288 |
| 2014/0175543 A1* | 6/2014 | Glass | H01L 21/823431 |
| | | | 257/337 |
| 2015/0287614 A1* | 10/2015 | Cheng | H01L 21/823807 |
| | | | 257/192 |
| 2016/0005621 A1* | 1/2016 | Toda | H01L 21/31116 |
| | | | 438/734 |
| 2016/0133480 A1* | 5/2016 | Ko | H01L 21/31116 |
| | | | 438/690 |
| 2016/0240381 A1* | 8/2016 | Long | H01L 21/228 |
| 2017/0092713 A1* | 3/2017 | Chen | H01L 27/0924 |
| 2017/0170321 A1* | 6/2017 | Cheng | H01L 29/7851 |
| 2017/0186747 A1* | 6/2017 | Doris | H01L 27/0924 |
| 2017/0263749 A1* | 9/2017 | Chang | H01L 29/161 |
| 2017/0271165 A1* | 9/2017 | Kal | H01L 21/322 |
| 2017/0278968 A1* | 9/2017 | Lan | H01L 29/7849 |
| 2017/0317211 A1* | 11/2017 | Kim | H01L 29/7827 |
| 2017/0352729 A1* | 12/2017 | Cheng | H01L 29/1054 |
| 2017/0358458 A1* | 12/2017 | Okada | H01L 21/02532 |
| 2017/0365716 A1* | 12/2017 | Chung | H01L 29/7848 |
| 2018/0005902 A1* | 1/2018 | Anderson | H01L 21/823828 |
| 2018/0019325 A1* | 1/2018 | Colinge | H01L 21/823431 |
| 2018/0019342 A1* | 1/2018 | Chang | H01L 29/0653 |
| 2018/0047847 A1* | 2/2018 | Doris | H01L 29/7851 |

* cited by examiner

METHODS FOR FORMING SEMICONDUCTORS BY DIFFUSION

BACKGROUND

Field

This disclosure relates generally to semiconductor processing and, more particularly, to formation of compound semiconductors by diffusion of semiconductor species.

Description of the Related Art

Semiconductor materials that exhibit high charge-carrier mobility have gained interest as possible materials for use in various electronic devices, such as transistors in integrated circuits. High charge-carrier mobility materials have a higher charge-carrier mobility than silicon, and may improve the performance of these electronic devices relative to forming the devices using silicon as the only semiconductor. Examples of high charge-carrier mobility semiconductor materials include compound semiconductors, such as silicon germanium. The deposition of such compound semiconductors on Si, however, may be prone to forming undesirably large numbers of defects. Consequently, there is a continuing need for methods and systems of forming high quality compound semiconductors.

SUMMARY

In some embodiments, a method for making a semiconductor device is provided. The method comprises forming a transistor channel region. Forming the transistor channel region comprises providing a vertically-extending silicon structure. An oxide layer is formed on a surface of the silicon structure. Material forming the oxide layer is selectively removed to reduce the thickness of the oxide layer. Subsequently, silicon-germanium is deposited on the oxide layer. The silicon structure is converted into a silicon germanium structure by annealing the germanium and silicon structure in an oxidizing environment to drive the germanium into the silicon structure.

In some other embodiments, a method for making a semiconductor device is provided. The method comprises providing a semiconductor structure comprising a first semiconductor material. An interlayer is formed on a surface of the semiconductor structure. The thickness of the interlayer is trimmed and a second semiconductor material is subsequently deposited on the interlayer. A compound semiconductor comprising the first and the second semiconductor materials is formed in the semiconductor structure by driving at least portions of the second semiconductor material through the interlayer and into the semiconductor structure.

In yet other embodiments, a method for making a semiconductor device is provided. The method comprises providing a semiconductor structure comprising a first semiconductor material. A second semiconductor material is subsequently deposited in contact with the first semiconductor material. The second semiconductor material is amorphous or polycrystalline. A compound semiconductor comprising the first and the second semiconductor materials is formed in the semiconductor structure by diffusing semiconductor species from the second semiconductor material into the semiconductor. A remaining portion of the second semiconductor material is removed after forming the compound semiconductor.

DETAILED DESCRIPTION

Due to difficulties in depositing high quality compound semiconductors, some proposed approaches for forming the compound semiconductors involve separately depositing the semiconductor species that form the compound semiconductor and then diffusing one of the semiconductor species into a structure containing the other semiconductor species to form the compound semiconductor. For example, one proposed approach for forming silicon germanium involves first forming epitaxial silicon and then subsequently depositing an epitaxial silicon germanium layer on the silicon. The silicon and silicon germanium layer are annealed in an oxidizing atmosphere. The oxidation causes germanium atoms to diffuse or be driven into the underlying silicon layer as the silicon atoms in the silicon germanium layer react with oxygen to form silicon oxide. As a result of the diffusion of the germanium atoms, the underlying silicon is converted into silicon germanium. This process may be referred to as germanium condensation.

Figure 1A:
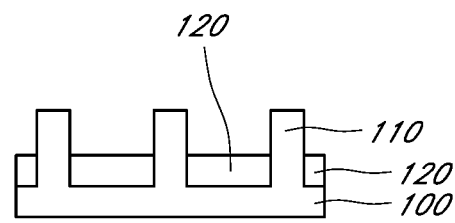
FIGS. 1A-1D illustrate examples of schematic, cross-sectional sideviews of a semiconductor device at various stages of a fabrication process flow.
Figure 1B:
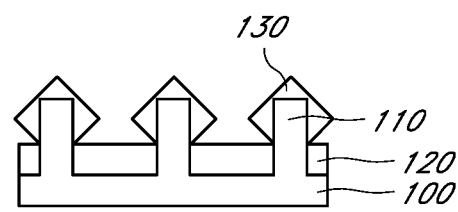
Figure 1C:
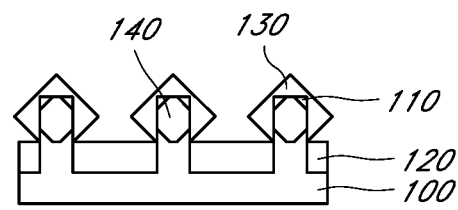
Figure 1D:
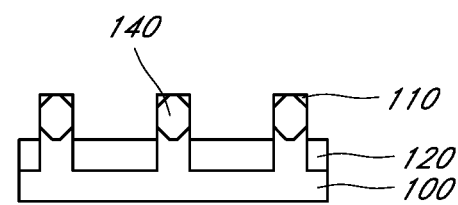

An example of a germanium condensation that has been studied is shown in FIGS. 1A-1D. These figures illustrate examples of schematic, cross-sectional sideviews of a semiconductor device at various stages of a fabrication process flow. FIG. 1A illustrates a crystalline silicon substrate 100 having upwardly extending portions 110, which are separated by oxide regions 120. Silicon germanium 130 may be epitaxially deposited on the portions 110. It has been found, however, that the silicon germanium layer is a poor source of germanium because the layer may be nonconformal such that it does not uniformly cover the portions 110, as shown in FIG. 1B. As a result, a subsequent anneal in an oxidizing atmosphere to drive germanium into the underlying silicon may result in significant non-uniformities in the concentration of germanium 140 in the portions 110, as shown in FIG. 1C. As shown in FIG. 1D, these non-uniformities may remain after removal of excess silicon germanium and silicon oxide from the surface of the portions 110. Undesirably, the non-uniformities may reduce the performance of electronic devices formed using these portions 110.

Without being limited by theory, it is believed that the non-uniform growth of silicon germanium on the surface of the portions 110 may be due to the crystalline nature of the epitaxial silicon forming the portions 110. Because silicon germanium itself may be crystalline and may also be grown epitaxially, the growth of the silicon germanium may occur preferentially in some crystallographic directions, resulting in a silicon germanium layer that has facets and is thus non-conformal.

In some embodiments, a compound semiconductor is formed by diffusion of semiconductor species from a source semiconductor layer into another semiconductor material. The source semiconductor layer may have an amorphous or polycrystalline structure (including a relaxed crystalline structure), and provides a source of semiconductor species for later diffusion into the other semiconductor material. Advantageously, such a semiconductor layer may be more conformal than an epitaxially grown, crystalline semiconductor layer. As a result, this more conformal semiconductor layer acts as a more uniform source of the semiconductor species for diffusion into the other semiconductor material.

In some embodiments, the amorphous or polycrystalline structure of the semiconductor layer is provided by forming the source semiconductor layer on a non-crystalline interlayer. Advantageously, without being limited by theory, it is believed that the relative lack of order of the atoms of the non-crystalline interlayer prevents the formation of a highly ordered crystalline layer on that interlayer. It has been found, however, that germanium condensation using such an interlayer provides lower concentrations of germanium in the portions 110 (FIG. 1D) than expected. In addition, these lower concentrations are present even where processes for forming thin interlayers are utilized. For example, atomic layer deposition, which is generally understood to provide a monolayer-by-monolayer deposition with a high degree of thickness control, nevertheless also may exhibit such undesirably low concentrations of germanium. Without being limited by theory, it is believed that the bare semiconductor surface on which the interlayer is formed (e.g., silicon oxide on a silicon surface) may be so highly reactive that the interlayer grows at-a rate that makes precise control over the thickness of the interlayer difficult. As a result, the interlayer may be prone to being overly thick, which causes the interlayer to function as a diffusion barrier that may block the diffusion of germanium into the portions 110.

Preferably, in some embodiments, the interlayer is trimmed before the overlying source semiconductor layer is deposited. It has been found that improved control over interlayer thickness may be achieved by trimming the interlayer, rather than attempting to set the interlayer thickness simply by the selection of deposition processes and/or conditions. Preferably, the interlayer is formed of a polycrystalline, or more preferably, an amorphous material, including dielectric materials, and preferably also may be made sufficiently thin, as described herein, to avoid functioning as a barrier layer to overlying chemical species for which diffusion into the underlying material is desired. The interlayer is also a different material from the underlying semiconductor material or the material forming the later-deposited source semiconductor layer. In some embodiments, the interlayer materials include oxides, nitrides, sulfides, phosphides, carbons, and combinations thereof. Examples of oxides include silicon oxide, germanium oxide, aluminum oxide, titanium oxide, and combinations thereof. Examples of nitrides include silicon nitride, germanium nitride, aluminum nitride, titanium nitride, and combinations thereof.

In some embodiments, the interlayer may be formed of the same material as the material that the source semiconductor layer will later be converted into (after driving a chemical species from that source semiconductor layer through the interlayer and into an underlying material). As discussed herein, a source semiconductor layer may be deposited on the interlayer material and at least one chemical species of that source semiconductor layer may be driven or diffused through the interlayer (e.g., by reacting the source semiconductor layer with another precursor species, such as an oxidant), which may convert the source semiconductor layer into a different material. For example, a silicon germanium layer may be deposited over the interlayer, and the silicon germanium layer may be oxidized to form a silicon oxide, thereby driving germanium from that silicon germanium layer through the interlayer and into an underlying material. The silicon germanium layer may thus be converted by the oxidation into a silicon oxide layer. In such embodiments, the interlayer is preferably also a silicon oxide layer, which provide advantages for removal of both layers by allowing the removal of these two layers using a single etch chemistry or process. Thus, in some embodiments, a single etch chemistry is utilized to remove the converted semiconductor source layer and the interlayer.

In some embodiments, the interlayer may be trimmed by reacting that interlayer with reactants that form a volatile product. The volatile product may be removed, e.g., by exposure to an elevated temperature. Examples of volatile products include ammonium hexafluorosilicate (($NH_4)_2SiF_6$)), which may be sublimated by exposure to elevated temperatures e.g., temperatures within the range of about 80° C. to about 100° C., including about 100° C. In some embodiments, the exposure to the elevated temperature may occur by loading the substrate containing the interlayer into a process chamber for the deposition of the second semiconductor material. In some embodiments, the thickness of the interlayer after being trimmed is about 0.1 nm to about 5 nm, including about 0.1 nm to about 2 nm, and about 0.1 nm to about 1 nm. In some embodiments, the trimmed interlayer is substantially continuous across the exposed surfaces of the first semiconductor material. In some other embodiments, the trimmed interlayer may have gaps exposing the first substrate material. Nevertheless, it will be understood that the presence of the interlayer prevents a long-range, highly ordered crystalline growth of the second semiconductor material.

In some embodiments, the interlayer is formed on the surface of a structure comprising a first semiconductor material, then subjected to a trim process, and then a second semiconductor material is deposited on the interlayer to form the source semiconductor layer. The second semiconductor material is subsequently driven into a structure containing the first semiconductor material, e.g., by subjecting the semiconductors and the structure to an elevated temperature, such as in an anneal, in an atmosphere containing a chemical species that reacts with the second semiconductor material. Preferably, the first and second semiconductor materials are different than the material forming the interlayer. It will be appreciated that the chemical species and the anneal may cause the second semiconductor material to diffuse into the structure containing the first semiconductor material. In some embodiments, the first semiconductor material comprises silicon, and the second semiconductor material comprises germanium, e.g. a layer of germanium or silicon germanium. As discussed herein, the anneal may be performed in an oxidizing atmosphere, which converts the silicon germanium into silicon oxide and drives the germanium into the silicon.

In some embodiments, sufficient material from the source semiconductor layer is driven or diffused into the structure containing the first semiconductor material to effectively displace the first semiconductor material. As a result, the structure may be converted into a structure formed of the diffused chemical species. For example, where germanium is diffused into a silicon structure, the level of diffusion may be such that the concentration of germanium in the structure is sufficiently high after the diffusion that the structure is essentially a germanium structure; viewed another way, the diffused germanium may be understood to drive out the silicon forming a structure.

In some other embodiments, the second semiconductor material of the source semiconductor layer may be directly deposited on the semiconductor structure by atomic layer deposition (ALD), without forming an intervening interlayer. Advantageously, such a deposition may form a semiconductor layer having an amorphous or polycrystalline in direct contact with the underlying first semiconductor material. For example, atomic layer deposition may be utilized to deposit germanium to form the source semiconductor layer. In some embodiments, a trimmed interlayer may be deposited before depositing the source semiconductor layer by ALD.

In some embodiments, the first semiconductor material may form a vertically-extending structure, such as a fin or nanowire. In some embodiments, the nanowire may be elongated laterally rather than vertically. Both of these vertically-extending and laterally-extending features may also referred to as protrusions. In some embodiments, the protrusions may form channel regions of transistor such as FinFet or nanowire transistors. A gate may be formed over and/or around a protrusion, and source/drain regions may be formed adjacent the protrusion, e.g., on opposite sides of the gate. In some embodiments, the transistor may be part of a complementary metal-oxide-semiconductor (CMOS) integrated circuit.

Advantageously, trimming the interlayer can facilitate the formation of high quality compound semiconductors, such as silicon germanium. For example, exceptionally thin interlayers may be formed. The thin interlayers may be amorphous or polycrystalline and may mitigate the epitaxial growth of overlying crystalline semiconductors, thereby facilitating the deposition of highly conformal semiconductor source layers on the interlayers. In addition, the trimmed interlayers may allow a high level of diffusion across the interlayer. It will be appreciated that the high levels of diffusion can provide advantages for process throughput and/or the formation of compound semiconductors with desirably high levels of a second semiconductor. In addition, a high degree of control over the interlayer thickness allows control over the crystalline structure of the deposited second semiconductor material. For example, for a given set of process conditions, the degree of crystallinity of a deposited layer of the second semiconductor material may be influenced by the thickness of the interlayer, with crystal size increasing with decreasing interlayer thickness. In embodiments in which the source semiconductor layer is deposited directly on the semiconductor structure containing the first semiconductor material, the process flow may advantageously be simplified by obviating the interlayer and subsequent trim.

Reference will now be made to the Figures. Like numerals refer to like features throughout.

Figure 2A:
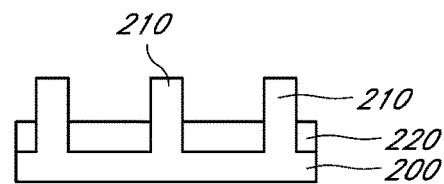
FIGS. 2A-2F illustrate examples of schematic, cross-sectional sideviews of a semiconductor device at various stages of a fabrication process flow according to some embodiments.

With reference now to FIGS. 2A-2F, examples of schematic, cross-sectional sideviews of a semiconductor device at various stages of a fabrication process flow according to some embodiments are illustrated. FIG. 2A illustrates a substrate 200, e.g. a silicon substrate, having portions 210 that will later be converted into a compound semiconductor. In some embodiments, the portions 210 are formed of the same material as the main body of the substrate 200. In some other embodiments, the portions 210 may be formed from a layer of material that has been deposited on the substrate 200 and may be a different material from the substrate 200.

As illustrated, the portions 210 may be protrusions, e.g., vertically or laterally-elongated structures. In some embodiments, the portions 210 may be laterally elongated structures such as fins for a FinFet. In some other embodiments, the portions 210 may be vertically- or laterally-extending pillars, such as a nanowires for nanowire-based transistors. The structures 210 may be part of an array of such structures in some embodiments.

It will be appreciated that the protrusions 210 may be formed by patterning the substrate 200. For example, a resist layer (not shown) may be deposited and patterned on the substrate 200. The substrate 200 may subsequently be etched through the resist layer. Overlying resist protects the portions of the substrate 200 that will form the protrusions 210, while the etch removes the exposed material between those protected portions. Any remaining resist may subsequently be removed. Optionally, dielectric regions 220 may be formed between the protrusions 210. In some embodiments, the dielectric regions 220 may be formed by deposition of a dielectric on and/or oxidation of the substrate 200 to form, e.g., silicon oxide trench isolation regions.

Figure 2B:
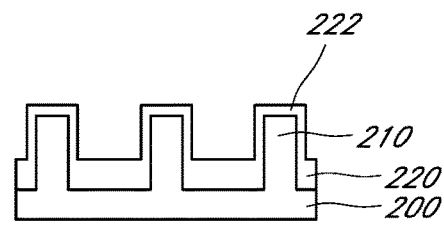

With reference now to FIG. 2B, an initial interlayer 222 is formed. Preferably, the interlayer 222 is formed of a material that prevents crystalline growth of a subsequently deposited semiconductor material. In some embodiments, the interlayer 222 is formed of an amorphous or polycrystalline material, such as a dielectric such as silicon oxide. In some embodiments, the initial interlayer 222 may be formed by growing a native oxide of the surface of the substrate 200, including the surface of the protrusions, e.g., by exposing the portions 210 to a reactant that reacts with the material of the protrusions 210. For example, the substrate may be thermally oxidized by contacting the substrate with oxidant, such as $O_2$, $O_3$, $H_2O$, $H_2O_2$, $N_2O$, NO, $NO_2$, $CH_3OH$, or combinations thereof. In some other embodiments, the interlayer may be formed by oxidation utilizing plasma-activated species (e.g. formed from the above-noted oxidants), or the interlayer may be formed by a wet process (e.g by dipping the substrate to a mixture of $H_2O$ with $O_3$ dissolved in it). In some embodiments, where a native oxide has formed, the native oxide itself may be utilized as the initial interlayer 222. In some other embodiments, any existing native oxide on the substrate surface may be removed before regrowing the native oxide as discussed herein. As another example, the substrate may be nitrided by exposure to a nitrogen precursor (e.g., $N_2$, NH3, or plasmas and combinations thereof) to forming nitrogen-containing (e.g. silicon nitride) interlayer.

In some other embodiments, the initial interlayer 222 may be formed by deposition using two or more reactants that react with one another. The deposition may be a chemical vapor deposition (CVD) in which the two or more mutually reactive reactants are provided simultaneously in a reaction chamber containing the substrate 200.

In some embodiments, the deposition may be an atomic layer deposition (ALD). It will be appreciated that ALD-type processes are based on controlled, self-limiting surface reactions and may provide precise control of the film composition and layer thickness, and high conformality, also being conducted at low temperatures relative to conventional CVD processes. Gas phase reactions are avoided by contacting, or exposing, the protrusions 210 alternately and sequentially with reactants. Vapor phase reactants are separated from each other in the reaction chamber, for example, by removing excess reactants and/or reactant byproducts from the volume containing the substrate between reactant pulses. Removing excess reactants and/or reactant byproducts may be achieved, for example, by purging the reaction space after each pulse of reactant gas using a vacuum and/or a purge gas. A purge gas may also be flowed continuously before, during, and after each pulse of reactant gas. For example, in some embodiments the purge gas may also serve as a carrier gas for one or more of the reactants. In some other embodiments, the alternating reactant exposures may be accomplished by movement of the substrate and/or reactor parts, without stopping and starting the flow of precursors into the deposition chamber to accomplish the alternating exposures. It will be appreciated that, as used herein, an exposure to a particular reactant may also be referred to as a "pulse," and "reactants" may also be referred to as "precursors." Exposure of the substrate to a sequence including each reactant for the deposition constitutes a deposition cycle; for example, where two reactants are utilized, exposing the substrate to a first and then a second reactant can constitute one deposition cycle.

Each reactant pulse is preferably self-limiting. An excess of reactant is supplied during the pulse to saturate the susceptible structure surfaces. In theory, surface saturation ensures reactant occupation of all available reactive sites (subject, for example, to physical size or "steric hindrance" restraints) and thus provides excellent step coverage. In some arrangements, the degree of self-limiting behavior can be adjusted by, e.g., allowing some overlap of reactant pulses to trade off deposition speed (by allowing some CVD-type reactions) against conformality. Ideal ALD conditions with reactants well separated in time and space provide self-limiting behavior and thus maximum conformality. In some embodiments, less than a complete monolayer is deposited in one or more cycles, for example due to steric hindrance. In some embodiments, more than one monolayer may be deposited by, for example, adjusting the deposition conditions to achieve some decomposition reaction, such as would occur in CVD or CVD-like processes. Limited CVD reactions mixed with the self-limiting ALD reactions can raise the deposition rate. The deposition cycles are repeated a desired number of times to form a layer of a desired thickness.

Deposition temperatures are preferably maintained below the precursor thermal decomposition temperature but at a high enough level to avoid condensation of reactants and to provide the activation energy for the desired surface reactions. The appropriate temperature window for any given ALD reaction will depend upon the surface termination and reactant species involved. The reaction temperature for the various atomic layer depositions herein may be in a range from about room temperature to about 500° C., including from about 20° C. to about 500° C., from about 150° C. to about 400° C., from about 200° C. to about 350° C., and from about 250° C. to about 300° C. in some embodiments.

The reaction pressure may be from about 0.1 Torr to about 760 Torr. In some embodiments, the reaction pressure may be from about 0.5 Torr to about atmospheric pressure.

Figure 2C:
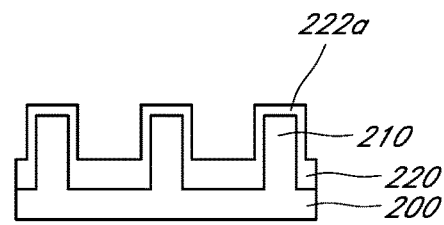

With reference now to FIG. 2C, the initial interlayer 222 is trimmed, or reduced in thickness, to form the trimmed interlayer 222a. In some embodiments, the trimming may be accomplished by reacting the initial interlayer 222 with a reactant that forms a volatile compound. Volatile compound may subsequently be exposed to conditions that cause it to be volatilized.

In some embodiments, to trim a silicon oxide interlayer 222, the interlayer 222 is reacted with ammonia and one or more fluorine-containing compounds to form ammonium hexafluorosilicate ($(NH_4)_2SiF_6$)), which may be subsequently volatilized (e.g., sublimated). Such an ammonia and fluorine-based trim process may provide advantageously high selectivity. It will be appreciated that such a trim process may be a pre-clean process in some embodiments.

For the ammonia and fluorine-based trim process, the substrate is preferably maintained at a temperature above a condensation temperature of the reactant gas during formation of the volatile material. For example, the substrate can be maintained at a temperature of greater than the condensation temperature by about 15° C., or about 20° C. In some embodiments, the substrate can be maintained at a temperature of about 15° C. to about 50° C., including about 15° C. to about 30° C., about 25° C. to about 30° C. For example, the substrate can be maintained at a temperature of about 22° C. to about 28° C., which may facilitate a high selectivity for the removal of silicon oxide relative to other exposed material, such as silicon nitride material, on the substrate surface.

The composition of the reactant gas of the trim process can include one or more carrier gases. A suitable carrier gas can include any number of inert gases. In some embodiments, the carrier gas can comprise argon (Ar). In some embodiments, the reactant gas can also include a halogen-containing gas. For example, the halogen-containing gas may be a fluorine-containing gas. Suitable fluorine-containing gases may include without limitation, nitrogen trifluoride ($NF_3$), hydrogen fluoride (HF), and/or diatomic fluoride ($F_2$). In some embodiments, the reactant gas may also include a hydrogen-containing gas. A suitable hydrogen-containing gas may include, for example, ammonia ($NH_3$).

As described herein, the volatile material may comprise one or more components formed by reaction of the reactant gas and a substrate surface silicon oxide. For example, a reactant gas comprising ammonia, and one or more fluorine-containing compounds may chemically react with the silicon oxide to generate water vapor, and a volatile material comprising nitrogen, hydrogen, and silicon. In some embodiments, ammonia and nitrogen trifluoride, hydrogen fluoride, and/or fluorine may react with silicon oxide to provide a volatile material comprising ammonium hexafluorosilicate ($(NH_4)_2SiF_6$). In some embodiments, the volatile material may comprise for example ammonium fluoride ($NH_4F$) and/or ammonium hydrogen fluoride ($NH_4HF_2$).

Without being limited by any particular theory or mode of operation, it is believed that ammonium fluoride ($NH_4F$) may be formed when a fluorine (F) atom from a halogen-containing constituent of the reactant gas (e.g., $NF_3$, HF, and/or $F_2$) reacts with ammonia ($NH_3$) to form hydrogen fluoride (HF), which may combine with ammonia ($NH_3$) to form ammonium fluoride ($NH_4F$). In some embodiments, ammonium fluoride may remove silicon oxide by decomposing and reacting with silicon oxide to form silicon tetrafluoride ($SiF_4$) and water vapor ($H_2O$), and the tetrafluoride ($SiF_4$) may combine with $NH_4F$ to form ammonium hexafluorosilicate ($(NH_4)_2SiF_6$), the ammonium hexafluorosilicate ($(NH_4)_2SiF_6$) forming a film layer on the substrate surface. For example, the electronegative fluorine (F) of ammonium fluoride may be attracted to the relatively more electropositive silicon (Si) of the silicon oxide, while ammonium ($NH_4^+$) may be attracted to oxygen (O) of the silicon oxide. In some embodiments, a volatile material comprising ammonium hexafluorosilicate ($(NH_4)_2SiF_6$) may be decomposed and/or volatilized by heating the substrate, for example decomposing to form tetrafluoride ($SiF_4$), ammonia ($NH_3$) and/or hydrogen fluoride (HF).

The volatile material may be removed (e.g., decomposed and/or volatilized) using various techniques. In some embodiments, the volatile material may be removed through heating of the substrate to a temperature near, at, or above a sublimation temperature of components of the volatile material. For example, the substrate may be heated to a temperature of about 80° C. to about 500° C., including about 80° C. to about 100° C., under conditions that facilitate sublimation of the volatile material. For example, the substrate may be heated to a temperature of about 100° C. to cause sublimation of the ammonium hexafluorosilicate (($NH_4$)$_2SiF_6$)). In some embodiments, the sublimation may occur by removing the substrate from the chamber in which the substrate is exposed to the ammonia and fluorine-based trim chemistry and then loading the substrate into a deposition chamber for forming an overlying source semiconductor layer. Elevated temperatures in a deposition chamber then cause the volatile material to be sublimated. In some other embodiments, the sublimation may occur in the same process chamber in which exposure to the ammonia and fluorine-based trim chemistry occur, or in a dedicated sublimation chamber. With continued reference to FIG. 2C, the trimmed interlayer has a smaller thickness than the initially-deposited interlayer 222 and may be referred to as interlayer 222a.

Figure 2D:
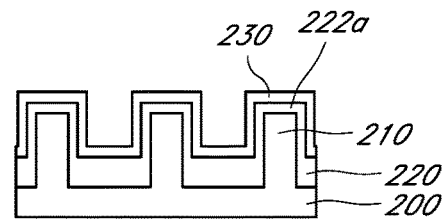

With reference now to FIG. 2D, a source semiconductor layer 230 is deposited. Preferably, the source semiconductor layer 230 is highly conformal. In some embodiments, the conformality of the source semiconductor layer 230 is greater than or equal to about 80%. It will be appreciated that the source semiconductor layer 230 is formed of a material containing the semiconductor species that will later be diffused into the protrusions 210. In some embodiments, the layer 230 contains only the desired chemical species. For example, the layer 230 may be a germanium layer. In some embodiments, the layer 230 is formed of a compound that contains the desired chemical species. For example, the layer 230 may be a silicon germanium layer.

The source semiconductor layer 230 may be deposited by various processes, including vapor deposition processes. In some embodiments, the source semiconductor layer 230 is deposited by CVD. For example, to form silicon germanium, trimmed interlayer 220a may be simultaneously exposed to silicon and germanium precursors. Examples of silicon precursors include silanes, including silane, disilane, and trisilane An example of a germanium precursor is germane ($GeH_4$). In some embodiments, the deposition is conducted at a deposition temperature in the range of about 300 to about 600° C., preferably about 380° C. to about 430° C., and a deposition pressure in the range of about 30 Torr to about 760 Torr. Lower temperatures and/or higher deposition rates may be utilized to provide a more amorphous film (e.g., smaller grains or no grains).

In some embodiments, trisilane and germane are utilized. Advantageously, trisilane may form layers with smaller grains than other silanes such as silane ($SiH_4$). The smaller grains may provide a more conformal layer. In addition, deposition with trisilane and germane can avoid undesired etching of the interlayer. For example, it has been found that deposition with conventional silicon germanium precursors such as dichlorosilane and germane can cause etching and removal of the interlayer, which may undesirably result in epitaxial growth of the silicon germanium. Advantageously, use of trisilane and germane can provide small grains and non-epitaxial growth of the silicon germanium layer.

In some other embodiments, the layer 230 is deposited by a cyclical vapor deposition process of alternating and sequential precursor exposures, such as ALD. For example, the cyclical vapor deposition process may include multiple deposition cycles, each cycle including alternately and sequentially contacting the exposed surfaces of the substrate 200 with a vapor phase germanium precursor and a vapor phase reducing agent, such as a nitrogen reactant. In the first part of the deposition cycle, a layer of the germanium precursor forms on the substrate surface. In the second part of the deposition cycle, the nitrogen reactant reacts with the germanium precursor to form a germanium thin film. In some embodiments the vapor deposition process is an atomic layer deposition process in which the germanium precursor does not decompose. However, in some other embodiments the germanium precursor at least partially decomposes during the deposition process.

In some embodiments, the relative amounts of silicon and germanium precursors delivered to the substrate may be varied over time to form a silicon germanium layer with a graded germanium composition. For example, the amount of germanium in the deposited layer 230 may vary with thickness (e.g., increase and/or decrease with thickness). It will be appreciated that the amount of precursors delivered to the substrate may be varied by changing the concentration of the precursors in gas flowed into the deposition chamber and/or (where the deposition was performed using a cyclic process) the number of exposures to a particular precursor may be increased or decreased relative to the number of exposures of another precursor.

In some embodiments a relatively pure germanium film is deposited. For example, the germanium film may be at least 90%, 95%, 97%, 98% or 99% pure germanium.

In some embodiments the germanium precursor may be an alkoxide. For example, in some embodiments the germanium precursor is selected from germanium ethoxide (GeOEt)$_4$ and tetrakis(dimethylamino) germanium (TDMAGe). Other possible germanium precursors are provided below and may include germanium compounds containing Ge—O bonds, Ge—C bonds (for example, germanium alkyls), or Ge—N bonds (for example, germanium alkylamines). In some embodiments the germanium precursor is not a halide. In some embodiments, the Ge precursor contains a halide in at least one ligand, but not in all ligands.

In some embodiments the nitrogen reactant comprises compounds containing N—H bonds, such as $NH_3$, hydrazine, nitrogen-containing plasma, atomic nitrogen, and/or nitrogen radicals.

In some embodiments, germanium-containing thin films are deposited by alternately and sequentially contacting a substrate with Ge($OCH_2CH_3$)$_4$ and $NH_3$. In some embodiments germanium thin films are deposited by alternately and sequentially contacting a substrate with tetrakis(dimethylamino) germanium (TDMAGe) and $NH_3$.

Figure 2E:
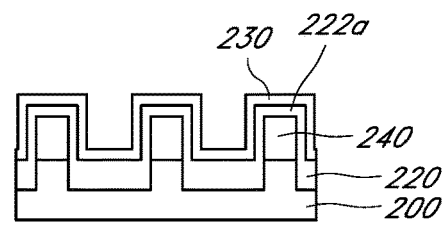

The cyclical deposition may form highly conformal germanium-containing films. In some embodiments, the germanium-containing films deposited have at least 50%, 80%, 90%, 95% or higher conformality. In some embodiments the films are about 100% conformal. With reference now to FIG. 2E, semiconductor species from the source semiconductor layer 230 is diffused through the trimmed interlayer 222a to convert underlying substrate material into the compound semiconductor 240. In some embodiments, as illustrated, the conversion may be localized in the protrusions 210 (FIG. 2D). For example, the dielectric regions 220 may function as diffusion barriers to prevent significant diffusion into the main body of the substrate 200. Advantageously, on the other hand, the trimmed interlayer 222a is sufficiently thin to allow a high rate of diffusion through that layer.

In some embodiments, the diffusion of the semiconductor species may be facilitated by subjecting the substrate 200 to an anneal. For example, the anneal may be conducted at temperatures of about 500-1500° C., including about 700-1100° C., including about 800-1000° C.

In some other embodiments, the diffusion of the semiconductor species may be facilitated by reacting the source semiconductor layer 230 in order to drive the desired semiconductor species out of that layer and into the protrusions 210. For example, the source semiconductor layer 230 may be oxidized by exposure to an oxygen precursor to, e.g., drive a semiconductor species out of the layer 230 so that the semiconductor species diffuses into the underlying protrusions 210. In some embodiments, the oxygen precursor may be $O_2$, $O_3$, $H_2O$, $H_2O_2$, $N_2O$, $NO$, $NO_2$, $CH_3OH$, or combinations thereof. Preferably, the reaction of the source semiconductor layer 230 is conducted at elevated temperatures, e.g., in conjunction with an anneal, such as described above. As an example, where the protrusions 210 are formed of silicon and the source semiconductor layer 230 is formed of silicon germanium, the silicon germanium may be oxidized to drive the germanium species into the protrusions 210 to convert the protrusions 210 into silicon germanium or pure germanium protrusions.

In some embodiments, before subjecting the substrate 200 to an anneal, an optional capping layer (not illustrated) is deposited on the source semiconductor layer 230. As an example, the capping layer may be a blanket layer that follows the contours of the source semiconductor layer 230. The capping layer may provide advantages for maintaining the structural integrity of the source semiconductor layer 230 by preventing undesired downward flow of the material forming the layer 230 during the anneal. It will be appreciated that this downward flow can result in thinning out of the layer 230, which may cause nonuniform amounts of material (along the heights of the protrusions) to diffuse into the protrusions 210. Examples of capping layer materials include silicon oxide, silicon nitride, and titanium nitride. In some embodiments, the capping layer material is the same as the material forming the interlayer and the material into which the source semiconductor layer has been converted after the anneal. For example, the capping layer, the interlayer, and the converted semiconductor layer may all be formed of silicon oxide in some embodiments.

Figure 2F:
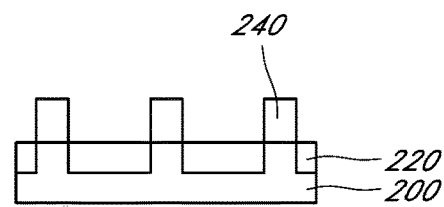

With reference now to FIG. 2F, the oxidized source semiconductor layer 230 and the interlayer 222a may be removed. In some embodiments, the removal may be accomplished by exposure to a wet etch selective for the material forming the layers 230 and 222a. Advantageously, in some embodiments, these two layers may comprise the same material (e.g., silicon oxide) and may be removed using a single etch, which may utilize a single etch chemistry.

As discussed herein, the protrusions 210 may be utilized in various electronic devices, such as transistors. In some embodiments, the protrusions 210 may form channel regions around which a gate is subsequently formed. In addition, source/drain regions may be formed on opposing sides of the gate and in electrical communication with the protrusions 210.

Figure 3A:
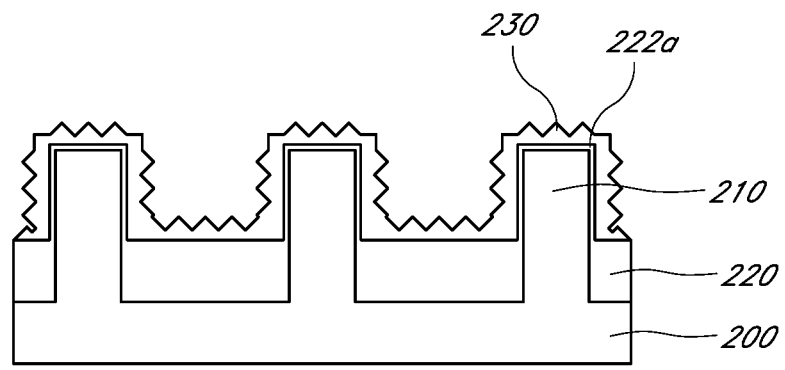
FIGS. 3A-3C illustrate examples of schematic, cross-sectional sideviews of a semiconductor device at various stages of a fabrication process flow according to some other embodiments.
Figure 3B:
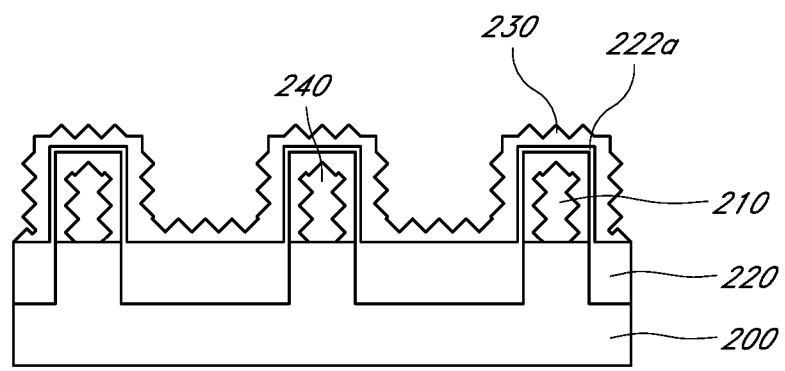
Figure 3C:
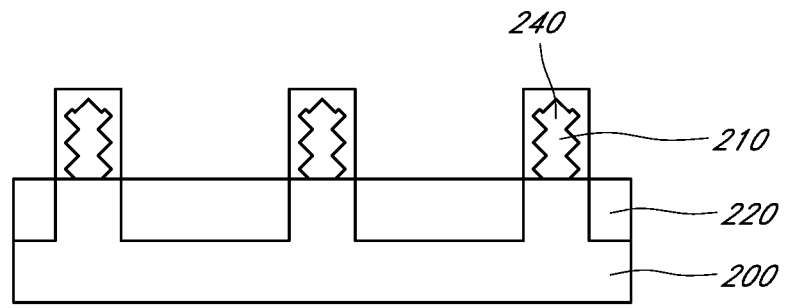

As discussed herein, it will be appreciated that the crystal structure of the substrate 200 may influence the crystal structure of the overlying source semiconductor layer 230 and that the interlayer 222a may modulate or attenuate that influence. In some embodiments, the interlayer 222a may be trimmed to such an extent that the source semiconductor layer 230 has a polycrystalline structure. In some other embodiments, the source semiconductor layer 230 may comprise epitaxial crystals within an amorphous or polycrystalline matrix. FIGS. 3A-3C illustrate examples of schematic, cross-sectional sideviews of a semiconductor device at various stages of a fabrication process flow in which the interlayer 222a is sufficiently thin to allow some faceted growth to occur in the source semiconductor layer 230. FIG. 3A illustrates the layer 230 after being deposited. Notably, the layer 230 has some polycrystalline or localized epitaxial crystal regions, which gives the layer a faceted appearance. As shown in FIG. 3B, the small facets in the layer 230 cause a spatially nonuniform concentration of semiconductors to diffuse into the protrusions 210 to form the compound semiconductor 240. As a result, the concentration of the diffused semiconductor species in the protrusions 210 is also spatially nonuniform, as shown in FIG. 3C. In some embodiments, however, the small size of the facets of the layer 230, while forming a compound semiconductor 240 with a nonuniform concentration of the diffused semiconductor, is nevertheless sufficiently uniform to provide good device (e.g., transistor) functionality.

Figure 4A:
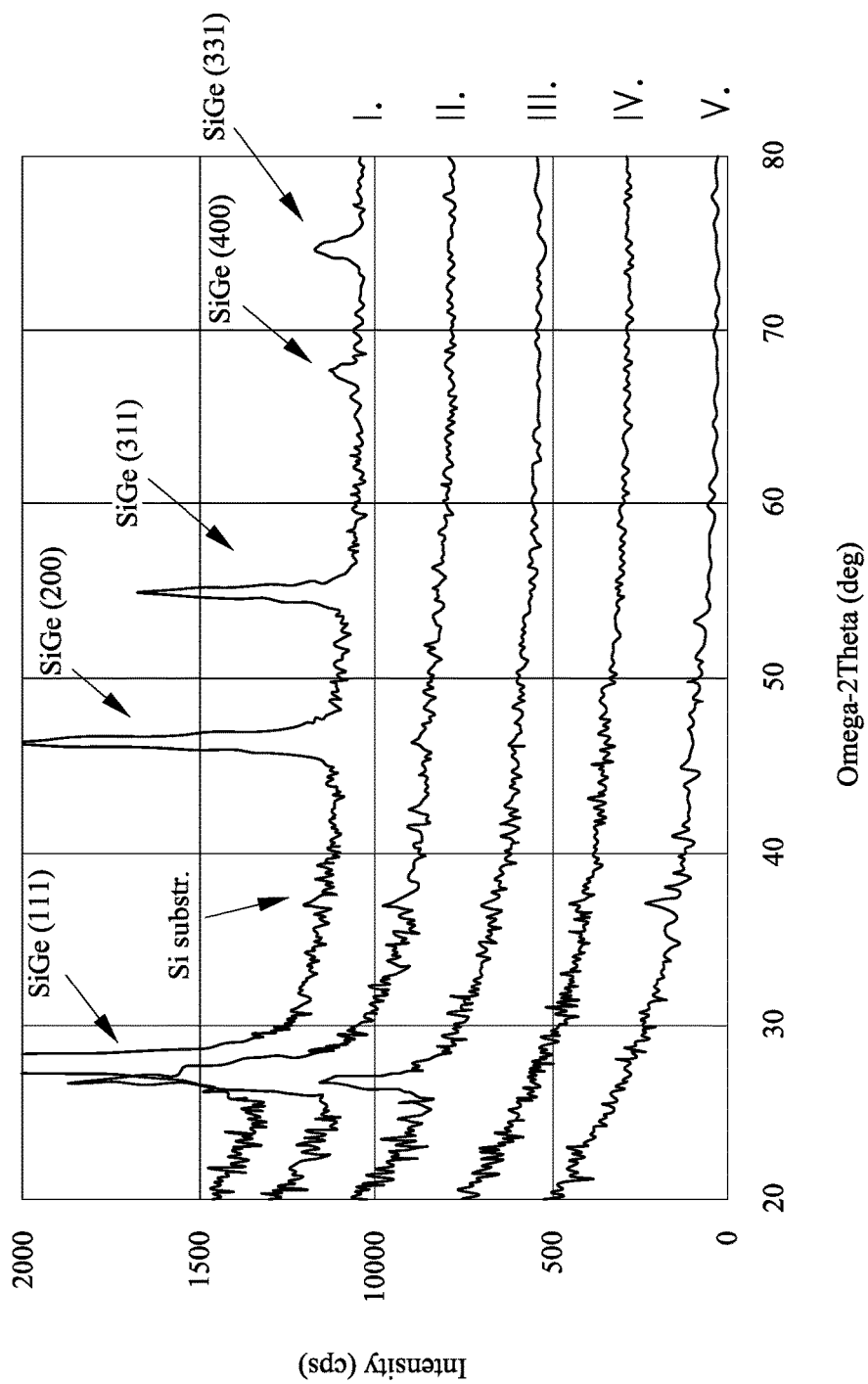
FIGS. 4A-4B illustrate plots of HRXRD and GI-XRD data for interlayers of various thicknesses.
Figure 4B:
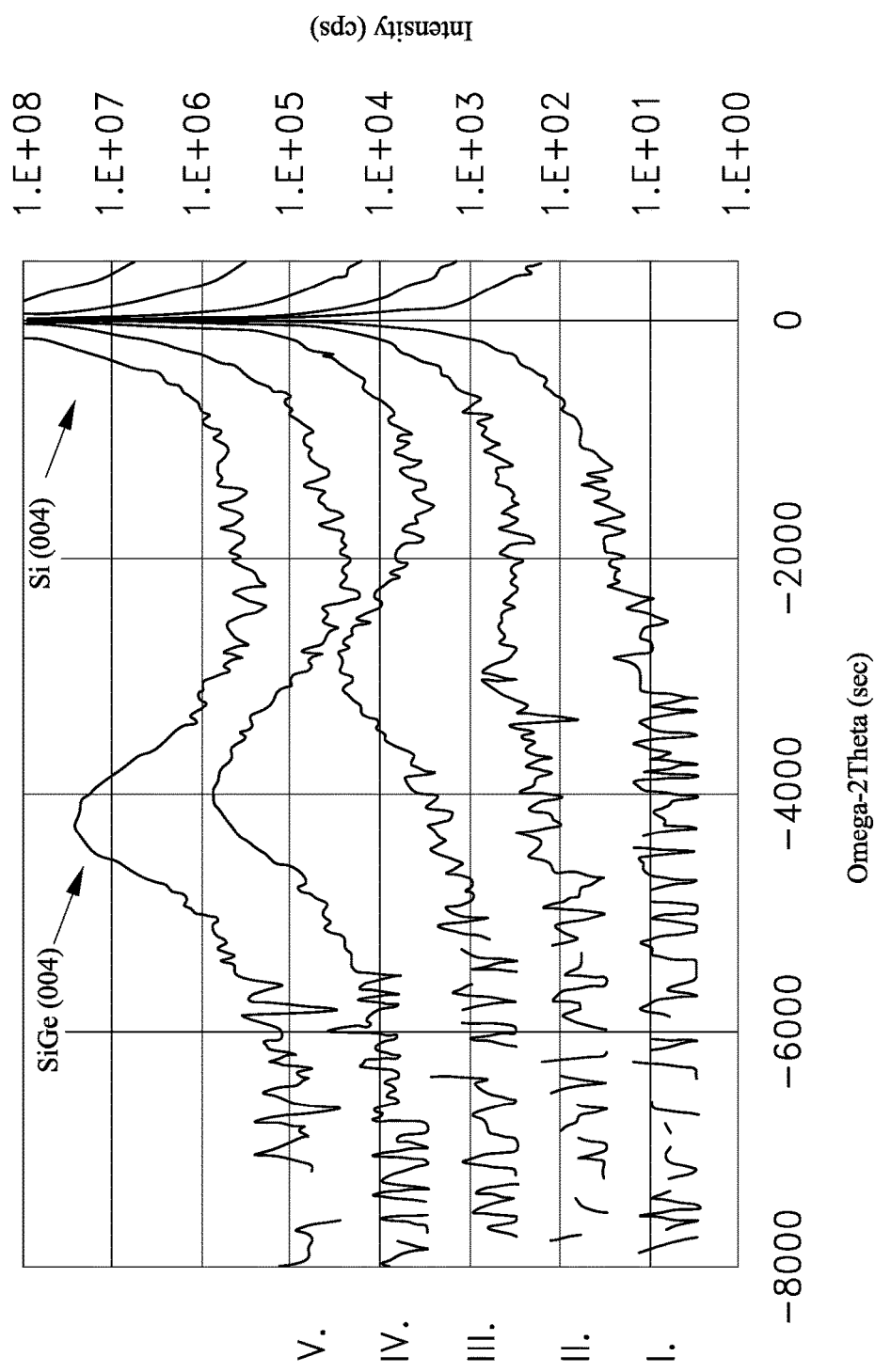

With reference now to FIGS. 4A-4B, plots of HRXRD and GI-XRD data for interlayers 222a of various thicknesses are illustrated. The interlayers were formed of silicon oxide grown to a thickness of 1 nm after cleaning the substrate with HF. The interlayers were trimmed for different lengths of time, as shown below, and a 50 nm silicon germanium layer was deposited on the interlayer. Consequently, the various illustrated X-ray diffraction scans (identified as I-V) correspond to samples having different interlayer thicknesses, which were obtained by conducting the trim process for different lengths of time as shown in Table 1 below. It will be appreciated that conducting the trim process for longer lengths of time resulted in thinner interlayers.

TABLE 1

| Sample | SiOx interlayer | SiOx trim | SiGe growth |
| --- | --- | --- | --- |
| I. | HF clean + 1 nm SiOx growth | no SiOx trim | 50 nm $Si_{50}Ge_{50}$ growth |
| II. | HF clean + 1 nm SiOx growth | 1.8 s SiOx trim | 50 nm $Si_{50}Ge_{50}$ growth |
| III. | HF clean + 1 nm SiOx growth | 3.5 s SiOx trim | 50 nm $Si_{50}Ge_{50}$ growth |
| IV. | HF clean + 1 nm SiOx growth | 5.3 s SiOx trim | 50 nm $Si_{50}Ge_{50}$ growth |
| V. | HF clean + 1 nm SiOx growth | 13.7 s SiOx trim | 50 nm $Si_{50}Ge_{50}$ growth |

Notably, the HRXRD and GI-XRD data show that silicon germanium phase may be tuned by trimming the interlayer. Advantageously, the silicon germanium phase may be selectively varied from single-crystal (plot line V) to polycrystalline (plot line I) by trimming the SiOx interlayer thickness for a given amount of time to achieve a corresponding interlayer thickness. It will be appreciated that the intermediate silicon germanium phases may comprise large (epitaxial) crystals in a polycrystalline matrix.

Figure 5A:
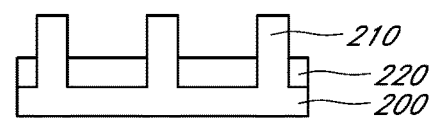
FIGS. 5A-5D illustrate examples of schematic, cross-sectional sideviews of a semiconductor device at various stages of a fabrication process flow according to some embodiments.

With reference now to FIGS. 5A-5D, examples of schematic, cross-sectional sideviews of a semiconductor device at various stages of a fabrication process flow that does not utilize an interlayer is illustrated. FIG. 5A illustrates a substrate 200 with protrusions 210 and intervening dielectric 220. It will be appreciated that these features may be formed substantially as discussed above regarding FIG. 2A.

Figure 5B:
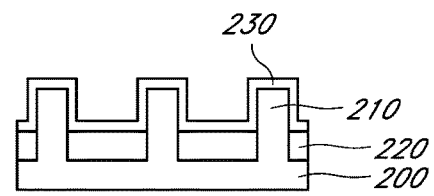

FIG. 5B illustrates the structure of FIG. 5A after a source semiconductor layer 230 is deposited directly on the underlying protrusions 210. It will be appreciated that the semiconductor layer 230 may physically contact the underlying protrusions 210. In some embodiments, the deposition forms a semiconductor layer 230 that is amorphous or polycrystalline as-deposited. Preferably, semiconductor layer 230 is deposited by ALD. An example of a suitable ALD process is disclosed above regarding FIG. 2D. For example, the layer 230 may be a germanium layer formed by ALD.

Figure 5C:
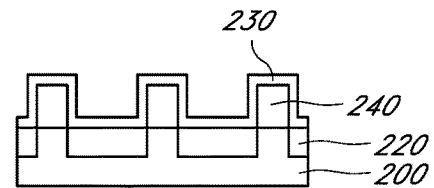
Figure 5D:
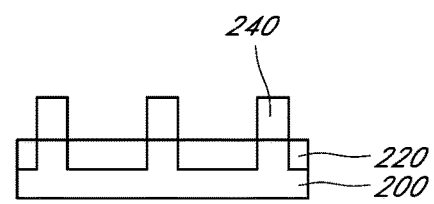

A semiconductor species from the semiconductor layer 230 may subsequently be diffused into the protrusions 210 to form a desired compound semiconductor 240, as shown in FIG. 5C. For example, the semiconductor 240 may be silicon germanium. The semiconductor species may be diffused into the protrusions 210 as discussed above regarding FIG. 2E. Subsequently, remaining portions of the semiconductor layer 230 may be removed as discussed above regarding FIG. 2F.

It will be appreciated by those skilled in the art that various omissions, additions and modifications can be made to the processes and structures described above without departing from the scope of the invention. For example, while advantageously applied to convert the material forming protrusions into a compound semiconductor, it will be appreciated that the processes disclosed herein may be applied to form compound semiconductors on localized portions of a planar substrate. In some embodiments, different locations on a substrate surface may comprise a sufficiently thin interlayer to allow diffusion of a semiconductor species into the substrate, while a diffusion barrier or a thicker interlayer is provided at other locations on the substrate surface to prevent such diffusion.

It is contemplated that various combinations or subcombinations of the specific features and aspects of the embodiments may be made and still fall within the scope of the description. Various features and aspects of the disclosed embodiments can be combined with, or substituted for, one another in order. All such modifications and changes are intended to fall within the scope of the invention, as defined by the appended claims.

What is claimed is:

1. A method for making a semiconductor device, comprising:
    forming a transistor channel region, wherein forming the transistor channel region comprises:
        providing a silicon protrusion;
        forming an oxide layer on a surface of the silicon protrusion;
        selectively removing, relative to other exposed materials, material forming exposed surfaces of the oxide layer to reduce an overall thickness of the oxide layer;
        subsequently depositing silicon-germanium on the oxide layer; and
        converting the silicon protrusion into a silicon germanium structure by annealing the silicon-germanium and silicon structure in an oxidizing environment to drive the germanium through the oxide layer and into the silicon protrusion.

2. The method of claim 1, wherein selectively removing material forming the oxide layer comprises:
    converting the exposed surfaces of the oxide layer into a volatile compound; and
    sublimating the volatile compound.

3. The method of claim 2, wherein the volatile compound comprises ammonium hexafluorosilicate.

4. The method of claim 1, wherein the silicon protrusion comprises a laterally elongated fin.

5. The method of claim 1, wherein the silicon protrusion comprises a nanowire.

6. The method of claim 1, wherein providing the silicon protrusion comprises:
    etching a silicon substrate through a mask to define the silicon structure; and
    forming a dielectric on opposing sides of the silicon structure.

7. A method for making a semiconductor device, comprising:
    providing a semiconductor structure comprising a first semiconductor material;
    forming an interlayer on a surface of the semiconductor structure;
    trimming a thickness of the interlayer;
    subsequently depositing a second semiconductor material on the interlayer; and
    driving at least portions of the second semiconductor material through the interlayer and into the semiconductor structure.

8. The method of claim 7, wherein the first semiconductor material comprises silicon.

9. The method of claim 7, wherein the second semiconductor material comprises germanium.

10. The method of claim 7, wherein driving at least portions of the second semiconductor material forms a compound semiconductor comprising the first and the second semiconductor materials in the semiconductor structure.

11. The method of claim 10, wherein the compound semiconductor comprises silicon germanium.

12. The method of claim 7, wherein the semiconductor structure is a silicon structures, wherein driving at least portions of the second semiconductor material converts the silicon structure into a germanium structure.

13. The method of claim 7, wherein the interlayer comprises an oxide of the first semiconductor material.

14. The method of claim 13, wherein trimming the thickness of the interlayer comprises:
    reacting the interlayer with a reactant gas comprising a fluorine-containing gas and a hydrogen-containing gas to form a halogen-containing material; and
    sublimating the halogen-containing material.

15. The method of claim 7, wherein forming the interlayer comprises depositing the interlayer.

16. The method of claim 15, wherein depositing the interlayer comprises depositing the interlayer by atomic layer deposition.

17. The method of claim 7, wherein forming the interlayer comprises:
    removing native oxide from the surface of the semiconductor substrate; and
    subsequently growing an oxide on the surface.

18. The method of claim 7, wherein depositing the second semiconductor material comprises performing an atomic layer deposition.

19. The method of claim 7, wherein driving at least portions of the second semiconductor material through the interlayer comprises subjecting the semiconductor structure to an anneal.

20. The method of claim 7, wherein the semiconductor structure comprises a protrusion formed of the first semiconductor material, wherein the surface is a surface of the protrusion.

21. The method of claim 20, wherein the vertical-extending structure is a fin.

22. The method of claim 20, wherein the vertical-extending structure is a nanowire.

23. The method of claim 20, further comprising forming a transistor gate at sides of the protrusion, wherein the protrusion forms a channel region of a transistor.

24. The method of claim 7, wherein depositing the second semiconductor material comprises depositing an amorphous layer of the second semiconductor.

* * * * *

UNITED STATES PATENT AND TRADEMARK OFFICE
CERTIFICATE OF CORRECTION

PATENT NO. : 10,141,189 B2  
APPLICATION NO. : 15/394571  
DATED : November 27, 2018  
INVENTOR(S) : Harald Profijt It is certified that error appears in the above-identified patent and that said Letters Patent is hereby corrected as shown below:

In the Drawings

Sheet 4 of 6 (FIG. 4A), Line 2 (approx.) (Y-axis), change "10000" to --1000--.

In the Specification

Column 4, Line 23-24, change "$((NH_4)_2SiF_6))$," to --$((NH_4)_2SiF_6)$,--.

Column 8, Line 2, change "$((NH_4)_2SiF_6))$," to --$((NH_4)_2SiF_6)$,--.

Column 9, Line 11-12, change "$((NH_4)_2SiF_6))$." to --$((NH_4)_2SiF_6)$.--.

Column 9, Line 46, change "trisilane An" to --trisilane. An--.

Signed and Sealed this  
Second Day of April, 2019

Andrei Iancu  
*Director of the United States Patent and Trademark Office*